(12) United States Patent
Cox et al.

(10) Patent No.: US 7,511,530 B1
(45) Date of Patent: Mar. 31, 2009

(54) NODAL CHARGE COMPENSATION FOR SST DRIVER HAVING DATA MUX IN OUTPUT STAGE

(75) Inventors: Carrie E. Cox, Apex, NC (US); Hayden C. Cranford, Jr., Cary, NC (US); Kenneth J. Shaw, Essex Junction, VT (US); Marc R. Turcotte, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/179,957

(22) Filed: Jul. 25, 2008

(51) Int. Cl.
*H03K 19/0175* (2006.01)
*H04L 25/02* (2006.01)

(52) U.S. Cl. .......................... 326/30; 326/83; 327/408

(58) Field of Classification Search .................. 326/30, 326/83, 86, 95, 96, 27; 327/408, 108, 112
See application file for complete search history.

(56) References Cited

U.S. PATENT DOCUMENTS 7,307,447 B2     12/2007  Clements et al.
2007/0103186 A1*  5/2007  Clements et al. .............. 326/30

OTHER PUBLICATIONS

Christian Menolfi, Thomas Toifl, Peter Buchmann, Marcel Kossel, Thomas Morf, Jonas Weiss, and Martin Schmatz, A 16Gb/s Source-Series Terminated Transmitter in 65nm CMOS SOI, 2007, pp. 446-447, 614,24.6.1-24.6.7, 2007, IEEE International Solid-State Circuits Conference.

* cited by examiner

*Primary Examiner*—Daniel D Chang
(74) *Attorney, Agent, or Firm*—Cantor Colburn LLP; Josh Cockburn

(57) ABSTRACT

An (SST) driver circuit having additional circuitry for minimizing data-dependent jitter in the SST driver and increasing frequency amplitude in the SST driver. The additional circuity comprises a plurality of switches configured to be turned on or pulsed on momentarily during operation to discharge a node in the SST output stage for the purpose of removing the stored charge before the next transition cycle of the output stage.

1 Claim, 3 Drawing Sheets

US 7,511,530 B1

NODAL CHARGE COMPENSATION FOR SST DRIVER HAVING DATA MUX IN OUTPUT STAGE

BACKGROUND

This invention relates to a high-speed data communication system, and particularly to a method of reducing data-dependent jitter and increasing frequency amplitude in a self-series terminated (SST) driver.

Some existing drivers/transmitters use current sources or voltage amplifiers that require a certain amount of voltage overhead to insure that the driver remains in the linear operating region of the current source or voltage amplifier. This voltage overhead increases the driver's power dissipation and decreases the maximum signal amplitude. Self-series terminated (SST) drivers are another class of voltage mode drivers. SST drivers operate in the voltage mode and are configured to solve power dissipation issues. However, these SST drivers can suffer from a data-dependant jitter phenomenon. In particular, these SST transmitter/drivers contain a half-rate-to-full-rate data serialization function incorporated into the design. Remaining data dependant stored charge from previous bits is the source of the data dependant jitter that has been observed in this type of design.

SUMMARY

An exemplary embodiment of a self-series terminated (SST) driver circuit for time multiplexing between a set of data signals through a set of select signals, comprising: an output port configured to generate an output signal of the SST driver circuit, the output signal being configured to transition from a first voltage state to a second voltage state during a bit period, the bit period being defined by the set of select signals changing from a first set of logical states to a second set of logical states; at least one intermediate node, the at least one intermediate node being forced to discharge from a first voltage to a second voltage based on the logical state of the set of data signals and when the at least one intermediate node is disconnected from the output signal of the SST driver circuit and when the set of select signals is in the first set of logical states; a set of transistor devices coupled to the at least one intermediate node, one of the set of transistor devices configured to couple the at least one intermediate node to the output signal while the other one of the set of transistor devices is configured to couple the at least one intermediate node to the first voltage; and a set of switches coupled to the at least one intermediate node, the set of switches configured to discharge the at least one intermediate node to the second voltage before the set of select signals transition from the first set of logical states to the second set of logical states enabling the time to drive the output signal from the first voltage state to the second voltage state to be less variable minimizing data-dependent jitter and increasing high-frequency amplitude in the SST driver circuit.

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
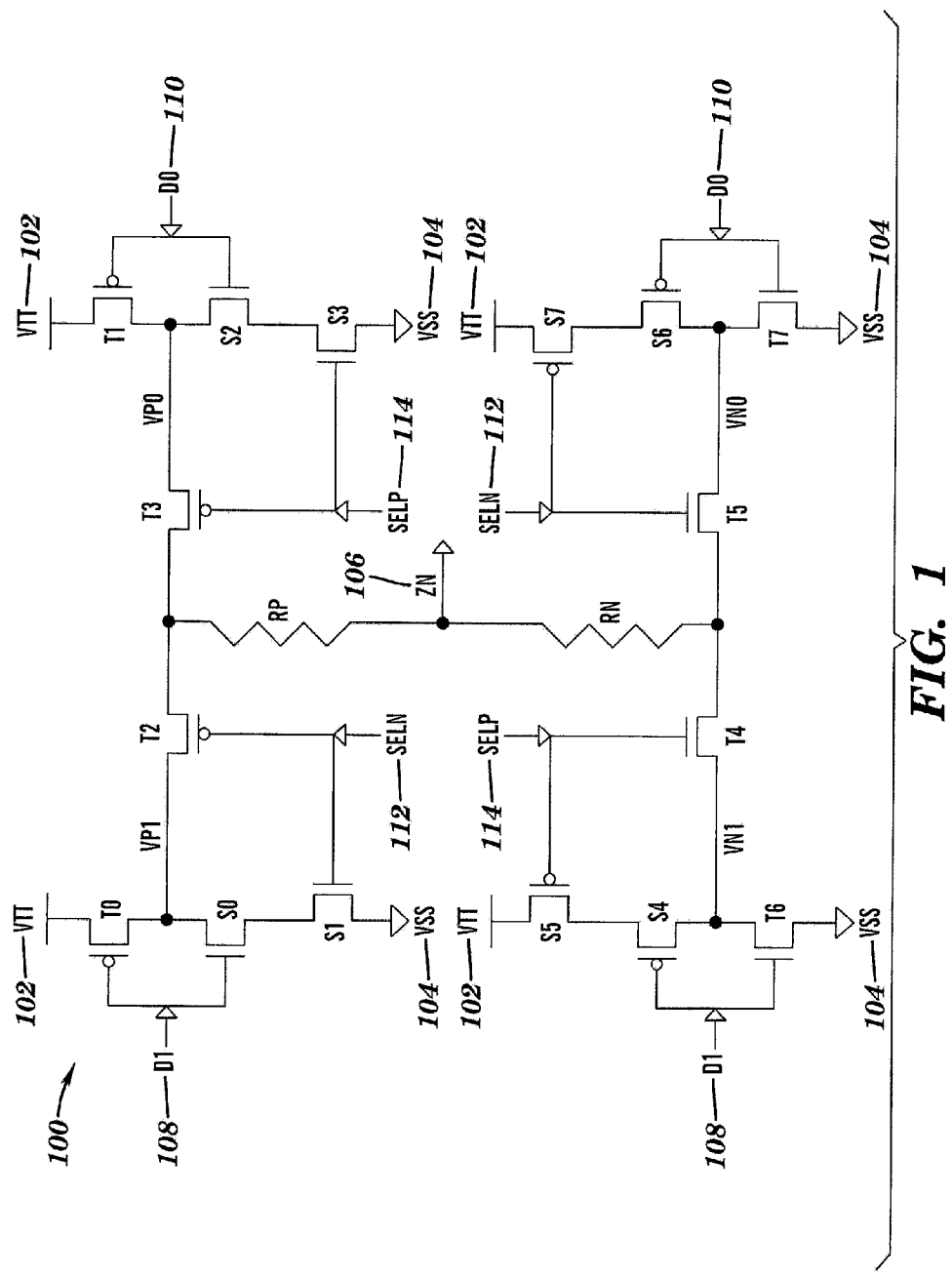
FIG. 1 illustrates a schematic of an SST driver with a plurality of switches for minimizing data-dependent jitter and increasing frequency amplitude frequency in accordance with one exemplary embodiment of the present invention.

The detailed description explains the preferred embodiments of the invention, together with advantages and features, by way of example with reference to the drawings.

DETAILED DESCRIPTION OF THE INVENTION

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known or conventional components and processing techniques are omitted so as to not necessarily obscure the present invention in detail. The examples used herein are intended merely to facilitate an understanding of ways in which the invention may be practiced and to further enable those of skill in the art to practice the invention. Accordingly, the examples should not be construed as limiting the scope of the invention.

It should be understood that the structure of Positive Channel Field Effect Transistors (PFETs) and Negative Channel Field Effect Transistors (NFETs) used in exemplary embodiments of the present invention in their simplest form include a gate electrode over a gate dielectric over a channel region in a semiconductor substrate with a source and a drain formed in the substrate on opposite sides of the channel region. It is contemplated that other structurally complex PFETs and NFETs as known in the art may be used in exemplary embodiments of the present invention.

The inventors herein have recognized an improved SST driver incorporating an additional circuit for minimizing data-dependent jitter and increasing high-frequency amplitude in the SST driver. The additional circuitry includes a plurality of switches operably turned on or pulsed on momentarily to discharge a node in the SST output stage for the purpose of removing the stored charge before the next transition cycle of the output stage.

FIG. 1 illustrates a self-series terminated (SST) driver 100 in accordance with one exemplary embodiment of the present invention. The SST driver 100 (single-ended mode driver) has the half-rate-to-full-rate data serialization function incorporated into its topology as shown. The SST driver 100 includes a first voltage rail 102, a second voltage rail 104, transistor devices $T_0$-$T_7$, switching devices $S_0$-$S_7$, resistors $R_p$ and $R_n$, intermediate nodes $V_{p1}$, $V_{n1}$, $V_{p0}$, and $V_{n0}$, and an output port 106 generating an output signal $Z_n$. The SST driver 100 is configured to receive data signals $D_0$, $D_1$ through data signal input lines 108 and 110 and a complementary clock signal (SELP, SELN) through select input lines 112 and 114. The logical state of SELN is the compliment of the logical state of SELP. The SST driver 100 acts as a multiplexer for time multiplexing between data signal $D_0$ and data signal $D_1$ through the clock signals SELP and SELN. The output signal $Z_n$ of the SST driver 100 can change every time the clock signals transition (during a bit time).

In accordance with one embodiment, the first voltage rail 102 is a high voltage level indicated by $V_{tt}$ while the second voltage rail 104 is a low voltage indicated by $V_{ss}$, which in accordance with one embodiment is at ground level. Of course, the voltage levels can vary depending on the desired application.

The SST driver 100 can be described as having four quadrants of circuitry for driving the output signal $Z_n$ where two quadrants are associated with data signal $D_0$ while the other two quadrants are associated with data signal $D_1$. The circuitry in the quadrants associated with data signal $D_1$ is a mirror image to the circuitry in the quadrants associated with data signal $D_0$ as shown. Thus, for ease of discussion only the two quadrants associated with data signal $D_1$ will be discuss in detail below.

Now turning to the details of the first quadrant in the SST driver 100 associated with data signal $D_1$. The switching device $S_0$ is coupled to data signal input line 108 thereby is configured to receive data signal $D_1$. The switching device $S_0$ is serially coupled to switching device $S_1$, which is coupled to $V_{ss}$. The switching device $S_0$ is coupled in parallel with transistor device $T_0$ by intermediate node $V_{p1}$. This parallel combination is coupled in series with transistor device $T_2$. Transistor device $T_2$ is coupled in parallel with transistor $T_3$ (part of another quadrant associated with data signal $D_0$), which in combination is connected in series with resistor $R_p$. Resistor $R_p$ is connected in series to output port 106. As discussed, similar statements can be made with the quadrant in the SST driver 100 that is a mirror image of this quadrant.

As for the second quadrant in the SST driver 100 associated with data signal $D_1$, switching element $S_4$ is coupled to data signal input line 108 thereby is configured to receive data signal $D_1$. The switching device $S_4$ is serially coupled to switching device $S_5$, which is coupled to $V_{tt}$. The switching device $S_4$ is coupled in parallel with transistor device $T_6$ by intermediate node $V_{n1}$. This parallel combination is coupled in series with transistor device $T_4$. Transistor device $T_4$ is coupled in parallel with transistor $T_5$ (part of another quadrant associated with data signal $D_0$), which in combination is connected in series with resistor $R_n$. Resistor $R_n$ is connected in series to output port 106. As discussed, similar statements can be made with the quadrant in the SST driver 100 that is a mirror image of this quadrant.

In one non-limiting embodiment, transistor devices $T_0$-$T_3$ are PFETs. Of course, other structurally complex PFETs may be used in other exemplary embodiments of the present invention and should not be limited to the configuration as shown. In one non-limiting embodiment, transistor devices $T_4$-$T_7$ are NFETs. Of course, other structurally NFETs may be used in other exemplary embodiments of the present invention and should not be limited to the configuration as shown.

In one non-limiting embodiment, switching devices $S_0$-$S_3$ are NFETs. Of course, other structurally complex NFETs may be used in other exemplary embodiments of the present invention and should not be limited to the configuration as shown. In one non-limiting embodiment, switching devices $S_4$-$S_7$ are PFETs. Of course, other structurally complex PFETs may be used in other exemplary embodiments of the present invention and should not be limited to the configuration as shown. The switching devices are configured to be small enough to limit parasitic capacitance in the driver.

In accordance with one embodiment, switching devices $S_0$-$S_7$ are used to correspondingly discharge the intermediate nodes ($V_{p1}$, $V_{p0}$, $V_{n1}$, $V_{n0}$) of the SST driver 100. The intermediates nodes are operably forced to a fixed or known voltage ($V_{tt}$ or $V_{ss}$) when the clock signal is inactive for the respective portion of the driver and when that particular intermediate node is not connected to the output signal $Z_n$. This will prevent a variable discharge time for output signal $Z_n$, thereby minimizing data-dependent jitter. In operation, intermediate node $V_{p1}$ is connected to output signal $Z_n$ when transistor device $T_2$ is on. Transistor device $T_2$ is on when SELN is at a logical 0. The intermediate node $V_{p1}$ is forced to fixed voltage $V_{ss}$ or $V_{tt}$ when SELN is at a logical 1. The intermediate node $V_{p1}$ is forced to a fixed voltage dependent on the state of data signal $D_1$ when SELN is at a logical 1. In particular, intermediate node $V_{p1}$=$V_{tt}$ if data signal $D_1$=0 through transistor device $T_0$ while $V_{p1}$=$V_{ss}$ (the other fixed voltage) if data signal $D_1$=1 through switching devices $S_0$ and $S_1$. Switching device $S_0$ is on when the transistor device $T_0$ is off. Switching device $S_1$ is on when $T_2$ is off. Thus, no two devices are driving intermediate node $V_{p1}$ simultaneously.

When the clock signals (SELP, SELN) transition from (0,1) to (1,0) after one bit-time (time between SELP, SELN= (0,1) until SELP, SELN=(1,0)) and $D_1$=1, the output signal $Z_n$ is connected to $V_{ss}$ via transistor devices $T_6$ and $T_4$. In other words, output signal $Z_n$ is driven to $V_{ss}$ when the clock signals (SELP, SELN) transition to (1,0) and $D_1$ is steady at 1 (state prior to transition). Before this transition, intermediate node $V_{p1}$ is discharged to $V_{ss}$ due to switches $S_0$ and $S_1$ as described above. That is, intermediate node $V_{p1}$ was previously forced to $V_{ss}$ when clocks signals SELP, SELN=(0, 1) and $D_1$=1. As such, the transition for output signal $Z_n$ to go from $V_{tt}$ to $V_{ss}$ is faster since intermediate node $V_{p1}$ was forced to $V_{ss}$ before the clock signals transition, in which output signal $Z_n$ is also being forced to $V_{ss}$ when the clock signals (SELP, SELN) transition. In other words, the output signal $Z_n$ has less capacitive load to discharge to $V_{ss}$ within a bit period because intermediate node $V_{p1}$ is already discharged to $V_{ss}$ before the clock signals transition.

Thus, the data output stage transition for output signal $Z_n$ when the clock signals transition is less variable since intermediate node $V_{p1}$ is also not variable during the transition of output signal $Z_n$. This minimizes or reduces data-dependent jitter in the system. This also increases the transition time for the output signal $Z_n$, which increases the bandwidth (faster data rate) in the system and which also increases the high-frequency amplitude in the system as well.

If the switching devices $S_0$, $S_1$ were not present, the intermediate node $V_{p1}$ could have previously been set to $V_{tt}$ when $D_1$ transitions from 0 to 1. If the intermediate node $V_{p1}$ is either $V_{tt}$ or $V_{ss}$ prior to the time when SELP, SELN=(1,0) and $D_1$=1, the time to discharge the output signal $Z_n$ to $V_{ss}$ is variable. The discharge time is variable because the discharge time of a capacitor is positively related to the voltage across the nodal capacitances present in the driver circuit. Since $V_{p1}$ is always $V_{ss}$ when SELP, SELN=(1,0) and $D_1$=1 due to switching devices $S_0$ and $S_1$ as described above, the time to discharge $Z_m$ to $V_{ss}$ is not variable (the voltage across the capacitances is always the same).

A complementary operation applies to $V_{n1}$ for the case where SELP, SELN=(0,1) and D1=0. That is, $V_{n1}$ is forced to $V_{tt}$ when SELP, SELN=(0,1) and $D_1$=0 through $S_4$ and $S_5$. When SELP, SELN=(0,1) and $D_1$=0 $Z_n$ is charged to $V_{tt}$ by $T_2$. The transition time of $Z_n$ to $V_{tt}$ is less variable since $V_{n1}$ is always at a fixed voltage. The transition time of $Z_n$ from $V_{ss}$ to $V_{tt}$ is faster since $V_{n1}$ is forced to $V_{ss}$ prior to the transition of $Z_n$ to $V_{tt}$.

It should be understood that the operation described above is also applicable for other data bit patterns for $V_{p0}$ and $V_{n0}$.

Figure 2:
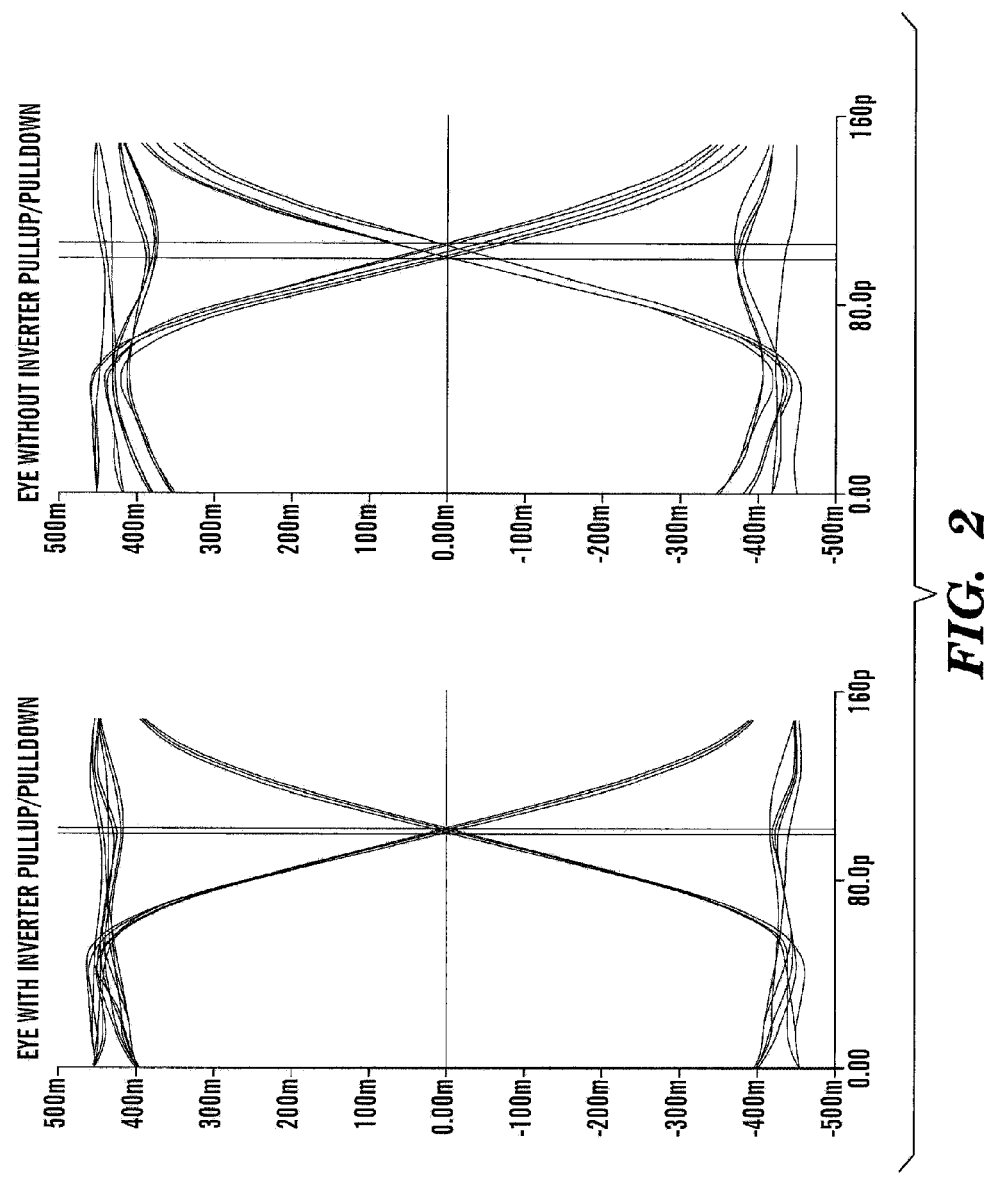
FIG. 2 illustrates an exemplary graph of the difference of a differential output signal of the SST driver with and without the plurality of switches in accordance with one exemplary embodiment.

The driver circuit 100 as shown and described above can be incorporated into a differential configuration terminating the outputs with a matching resistance to $V_{ss}$. That is, the topology is duplicated where the duplicate has negated incoming data. The difference of the two outputs is the differential output signal. FIG. 2 illustrates the difference in the differential output signal with and without the methodology described above and the incorporation of switching devices $S_0$-$S_7$.

The SST driver 100 (and/or receiver) is terminated with an impedance through resistors $R_p$ and $R_n$ that matches the characteristic impedance of the transmission path linking the transmitter and receiver. The SST driver 100 maintains constant output impedance while allowing the control circuits to switch the signal output to the desired level.

Figure 3:
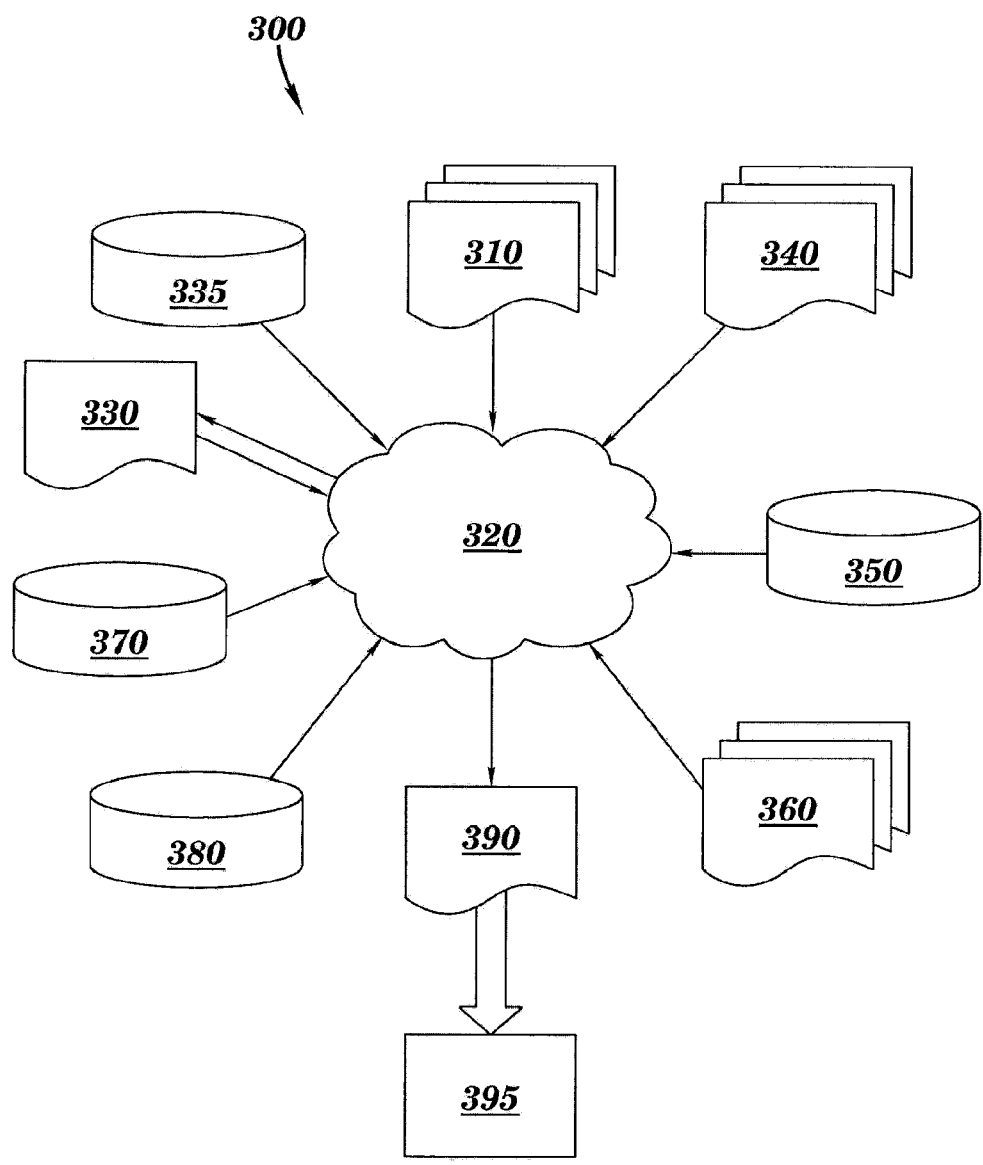
FIG. 3 illustrates a block diagram of an example of a design flow in accordance with one exemplary embodiment of the present invention.

FIG. 3 illustrates multiple such design structures including an input design structure 310 that is preferably processed by a design process 320. Design structure 310 may be a logical simulation design structure generated and processed by design process 320 to produce a logically equivalent functional representation of a hardware device. Design structure 310 may also or alternatively comprise data and/or program instructions that when processed by design process 320, generate a functional representation of the physical structure of a hardware device. Whether representing functional and/or structural design features, design structure 310 may be generated using electronic computer-aided design (ECAD) such as implemented by a core developer/designer. When encoded on a machine-readable data transmission, gate array, or storage medium, design structure 310 may be accessed and processed by one or more hardware and/or software modules within design process 320 to simulate or otherwise functionally represent an electronic component, circuit, electronic or logic module, apparatus, device, or system such as those shown in FIG. 1. As such, design structure 310 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 320 preferably employs and incorporates hardware and/or software modules for synthesizing, translating, or otherwise processing a design/simulation functional equivalent of the components, circuits, devices, or logic structures shown in FIG. 1 to generate a netlist 330 which may contain design structures such as design structure 310. Netlist 330 may comprise, for example, compiled or otherwise processed data structures representing a list of wires, discrete components, logic gates, control circuits, I/O devices, models, etc. that describes the connections to other elements and circuits in an integrated circuit design. Netlist 330 may be synthesized using an iterative process in which netlist 330 is resynthesized one or more times depending on design specifications and parameters for the device. As with other design structure types described herein, netlist 330 may be recorded on a machine-readable data storage medium 315 or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 320 may include hardware and software modules for processing a variety of input data structure types including netlist 330. Such data structure types may reside, for example, within library elements 335 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 360, design rules 370, and test data files 380 which may include input test patterns, output test results, and other testing information. Design process 320 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 320 without deviating from the scope and spirit of the invention. Design process 320 may also include modules for performing standard circuit design processes such as timing analysis, verification, design rule checking, place and route operations, etc.

Design process 320 employs and incorporates logic and physical design tools such as HDL compilers and simulation model build tools to process design structure 310 together with some or all of the depicted supporting data structures along with any additional mechanical design or data (if applicable), to generate a second design structure 390. Design structure 390 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 310, design structure 390 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 390 may comprise a compiled, executable HDL simulation model that functionally simulates the devices shown in FIG. 1.

Design structure 390 may also employ a data format used for the exchange of layout data of integrated circuits and/or symbolic data format (e.g., information stored in a GDSII (GDS2), GL1, OASIS, map files, or any other suitable format for storing such design data structures). Design structure 390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 390 may then proceed to a stage 395 where, for example, design structure 390: proceeds to tape-out, is released to manufacturing, is released to a mask house, is sent to another design house, is sent back to the customer, etc.

In view of the above, the present method embodiments may therefore take the form of computer or controller implemented processes and apparatuses for practicing those processes. The disclosure can also be embodied in the form of computer program code containing instructions embodied in tangible media, such as floppy diskettes, CD-ROMs, hard drives, or any other computer-readable storage medium, wherein, when the computer program code is loaded into and executed by a computer or controller, the computer becomes an apparatus for practicing the invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A self-series terminated (SST) driver circuit for time multiplexing between a set of data signals through a set of select signals, comprising:

an output port configured to generate an output signal of the SST driver circuit, the output signal being configured to transition from a first voltage state to a second voltage state during a bit period, the bit period being defined by the set of select signals changing from a first set of logical states to a second set of logical states;

at least one intermediate node, the at least one intermediate node being forced to discharge from a first voltage to a second voltage based on the logical state of the set of data signals and when the at least one intermediate node is disconnected from the output signal of the SST driver circuit and when the set of select signals is in the first set of logical states;

a set of transistor devices coupled to the at least one intermediate node, one of the set of transistor devices configured to couple the at least one intermediate node to the output signal while the other one of the set of transistor devices is configured to couple the at least one intermediate node to the first voltage; and a set of switches coupled to the at least one intermediate node, the set of switches configured to discharge the at least one intermediate node to the second voltage before the set of select signals transition from the first set of logical states to the second set of logical states decreasing the time variability to drive the output signal from the first voltage state to the second voltage state minimizing data-dependent jitter and increasing high-frequency amplitude in the SST driver circuit.

* * * * *